(12) United States Patent
Li et al.

(10) Patent No.: US 12,089,377 B2
(45) Date of Patent: Sep. 10, 2024

(54) COOLING SYSTEM AND DATA CENTER

(71) Applicant: Huawei Digital Power Technologies Co., Ltd., Shenzhen (CN)

(72) Inventors: Jian Li, Xi'an (CN); Mingming Pu, Xi'an (CN); Zonghao Yang, Xi'an (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 336 days.

(21) Appl. No.: 17/582,919

(22) Filed: Jan. 24, 2022

(65) Prior Publication Data

US 2022/0240423 A1    Jul. 28, 2022

(30) Foreign Application Priority Data

Jan. 25, 2021    (CN) .......................... 202110100476.2

(51) Int. Cl.
*H05K 7/20*    (2006.01)

(52) U.S. Cl.
CPC ..... *H05K 7/20836* (2013.01); *H05K 7/20309* (2013.01); *H05K 7/20318* (2013.01); *H05K 7/20745* (2013.01); *H05K 7/20827* (2013.01)

(58) Field of Classification Search
CPC .......... H05K 7/20836; H05K 7/20745; H05K 7/20827; F24F 12/006; F24F 2012/007
See application file for complete search history.

(56) References Cited

U.S. PATENT DOCUMENTS

| | | | | |
|---|---|---|---|---|
| 7,231,967 | B2* | 6/2007 | Haglid | ................ B25B 27/0035 |
| | | | | 165/231 |
| 7,370,490 | B2* | 5/2008 | Li | .......................... F24F 13/222 |
| | | | | 62/305 |
| 2011/0271695 | A1 | 11/2011 | Kashirajima et al. | |
| 2012/0291465 | A1 | 11/2012 | Kashirajima et al. | |
| 2013/0048267 | A1 | 2/2013 | Koretomo et al. | |
| 2013/0283837 | A1 | 10/2013 | Takahashi et al. | |

FOREIGN PATENT DOCUMENTS

| | | | |
|---|---|---|---|
| CN | 201281431 | Y | 7/2009 |
| CN | 102425822 | B * | 12/2013 |
| CN | 204084598 | U | 1/2015 |
| CN | 105546673 | A | 5/2016 |

(Continued)

*Primary Examiner* — Lionel Nouketcha
(74) *Attorney, Agent, or Firm* — Leydig, Voit & Mayer, Ltd.

(57) ABSTRACT

This application provides a cooling system, including a heat exchanger, a cooling supplement component, a bypass vent valve, and a controller. The heat exchanger includes an air intake vent A and an air exhaust vent B that are used for outdoor fresh air entry and discharge, and an air intake vent C and an air exhaust vent D that are used for indoor return air entry and discharge. The cooling supplement component includes a condenser and an evaporator, the condenser is connected to the air exhaust vent B by using an exhaust air pipe, and the evaporator is connected to the air exhaust vent D. The bypass vent valve is disposed on the exhaust air pipe, and the bypass vent valve communicates with outdoor air. The bypass vent valve is connected to the controller, and the controller is configured to control the bypass vent valve.

20 Claims, 7 Drawing Sheets

(56) References Cited

FOREIGN PATENT DOCUMENTS

| | | |
|---|---|---|
| CN | 205481475 U | 8/2016 |
| CN | 106871395 A | 6/2017 |
| CN | 107869928 A | 4/2018 |
| CN | 108413532 A | 8/2018 |
| CN | 109028391 A | 12/2018 |
| CN | 208253826 U | 12/2018 |
| CN | 109340960 A | 2/2019 |
| CN | 110691492 A | 1/2020 |
| CN | 211503094 U | 9/2020 |
| CN | 112097353 A | 12/2020 |
| CN | 213029060 U | 4/2021 |
| CN | 112954955 A | 6/2021 |
| FR | 3013269 A1 | 5/2015 |
| JP | H08142634 A | 6/1996 |
| JP | 2011043291 A | 3/2011 |
| JP | 2011208887 A | 10/2011 |
| WO | 2017118213 A1 | 7/2017 |

\* cited by examiner

COOLING SYSTEM AND DATA CENTER

CROSS-REFERENCE TO RELATED APPLICATIONS

This application claims priority to Chinese Patent Application No. 202110100476.2, filed on Jan. 25, 2021, which is hereby incorporated by reference in its entirety.

TECHNICAL FIELD

Embodiments of this application relate to the field of heat dissipation technologies in an equipment room, and in particular, to a cooling system and a data center in which the cooling system is installed.

BACKGROUND

With development of communications technologies, a heat dissipation problem in an equipment room or a cabinet in a data center is increasingly obvious. Currently, a cooling system for performing heat dissipation on an electronic device in an equipment room or a cabinet in a data center usually uses a solution that combines indirect evaporative cooling and refrigerant cooling to ensure an abundant cooling capacity. However, when a temperature of air outside the equipment room or the cabinet in the data center is higher than a temperature of indoor air, in an indirect evaporative cooling unit of the cooling system, the outdoor air is prone to reversely heat the indoor air, which results in cooling capacity attenuation, and affects normal working of the data center.

SUMMARY

In view of this, embodiments of this application provide a cooling system, to perform heat dissipation in an equipment room or a cabinet in a data center. The cooling system can effectively suppress reverse heating of an indirect evaporative cooling unit, inhibit cooling capacity attenuation, and resolve, to some extent, an existing problem of cooling capacity attenuation in the cooling system caused by reverse heating of the indirect evaporative cooling unit.

Specifically, a first aspect of the embodiments of this application provides a cooling system. The cooling system includes a heat exchanger, a cooling supplement component, a bypass vent valve, and a controller.

The heat exchanger includes an air intake vent A and an air exhaust vent B that are used for outdoor fresh air entry and discharge, and an air intake vent C and an air exhaust vent D that are used for indoor return air entry and discharge; the cooling supplement component includes a condenser and an evaporator, the condenser is connected to the air exhaust vent B by using an exhaust air pipe, and the evaporator is connected to the air exhaust vent D; the bypass vent valve is disposed on the exhaust air pipe, and the bypass vent valve communicates with outdoor air; and the bypass vent valve is connected to the controller, and the controller is configured to control the bypass vent valve. According to the cooling system in this embodiment of this application, indoor air may be cooled through combined refrigeration of indirect evaporative cooling of the heat exchanger and the cooling supplement component. In addition, when reverse heating occurs on the heat exchanger, an opening degree of the bypass vent valve can be controlled to suppress reverse heating of the heat exchanger and effectively suppress cooling capacity attenuation. The cooling system may be configured to perform heat dissipation in an equipment room or a cabinet in a data center, can be adapted to various outdoor temperature conditions, and can better perform heat dissipation on an electronic device in the equipment room or the cabinet when a temperature of the outdoor air is relatively high. The cooling system may also be configured to perform heat dissipation in other indoor space having cooling and heat dissipation requirements.

In this implementation of this application, the cooling system further includes a temperature sensor, and the temperature sensor is configured to monitor a temperature of fresh air that enters the heat exchanger through the air intake vent A and a temperature of the air exhaust vent B, or is configured to monitor a temperature of the air intake vent C and a temperature of the air exhaust vent D; and the controller is specifically configured to:

control the bypass vent valve based on the temperature of the fresh air and the temperature of the air exhaust vent B or based on the temperature of the air intake vent C and the temperature of the air exhaust vent D.

In an implementation of this application, the controller is specifically configured to:

when the cooling supplement component is in a working state, and a temperature of the air intake vent A is higher than the temperature of the air exhaust vent B or the temperature of the air intake vent C is lower than the temperature of the air exhaust vent D, control an opening degree of the bypass vent valve to increase, where the temperature of the air intake vent A is obtained based on the temperature of the fresh air. When the temperature sensor detects that the temperature of the air intake vent A is higher than the temperature of the air exhaust vent B or the temperature of the air intake vent C is lower than the temperature of the air exhaust vent D, it indicates that a temperature of outdoor fresh air that enters the heat exchanger through the air intake vent A decreases after the heat exchanger performs heat exchange on the outdoor fresh air, that is, the outdoor fresh air reversely heats indoor return air in the heat exchanger. If a greater difference between the temperature of the air intake vent A and the temperature of the air exhaust vent B leads to a greater difference between the temperature of the air exhaust vent D and the temperature of the air intake vent C, it indicates that reverse heating is severe. Because the bypass vent valve communicates with the outdoor air, the opening degree of the bypass vent valve can be controlled to increase, so that an amount of air that directly enters the exhaust air pipe through the bypass vent valve increases, to suppress working of the heat exchanger and suppress the cooling capacity attenuation caused by reverse heating.

In this implementation of this application, the opening degree of the bypass vent valve is controlled to increase, so that the temperature of the air intake vent A is lower than or equal to the temperature of the air exhaust vent B, or the temperature of the air intake vent C is higher than or equal to the temperature of the air exhaust vent D. In this implementation of this application, the opening degree of the bypass vent valve is controlled to increase, and a final opening degree of the bypass vent valve is not limited. In an implementation, the opening degree of the bypass vent valve is controlled to increase until the temperature of the air intake vent A is lower than or equal to the temperature of the air exhaust vent B or the temperature of the air intake vent C is higher than or equal to the temperature of the air exhaust vent D. In this case, the opening degree of the bypass vent valve may be lower than or equal to 100%. When the temperature of the air intake vent A is lower than or equal to the temperature of the air exhaust vent B or the temperature of the air intake vent C is higher than or equal to the temperature of the air exhaust vent D, the reverse heating phenomenon disappears. In an implementation, the opening degree of the bypass vent valve is controlled to increase to 100%. In an implementation of this application, the cooling system further includes a first air valve, the first air valve is disposed in a fresh air pipe communicating with the air intake vent A, and the fresh air pipe communicates with outdoor air.

The controller is further configured to control the first air valve based on the temperature of the fresh air and the temperature of the air exhaust vent B or based on the temperature of the air intake vent C and the temperature of the air exhaust vent D. The first air valve may be disposed to regulate a volume of fresh air that enters the heat exchanger from the fresh air pipe, so as to reduce heat exchange in the heat exchanger, thereby facilitating suppression of reverse heating of the heat exchanger. When reverse heating is severe, the first air valve may be closed, and refrigeration is performed only by the cooling supplement component.

In an implementation of this application, the controller is specifically configured to:

when the cooling supplement component is in the working state, and the temperature of the air intake vent A is higher than the temperature of the air exhaust vent B or the temperature of the air intake vent C is lower than the temperature of the air exhaust vent D, control an opening degree of the first air valve to decrease, where the temperature of the air intake vent A is obtained based on the temperature of the fresh air. When the reverse heating phenomenon occurs in the heat exchanger, the volume of fresh air that enters the heat exchanger from the fresh air pipe can be reduced by controlling the opening degree of the first air valve, and a resistance for the outdoor air of the bypass vent valve to enter the exhaust air pipe can be reduced, which helps the outdoor air to enter the exhaust air pipe through the bypass vent valve, and further helps to suppress reverse heating of the heat exchanger.

In some implementations of this application, the temperature sensor is configured to monitor the temperature of the fresh air that enters the heat exchanger through the air intake vent A and the temperature of the air in tank vent C, and the controller is further configured to:

when the temperature of the air intake vent A is lower than the temperature of the air intake vent C, control the opening degree of the bypass vent valve to be 0, where the temperature of the air intake vent A is obtained based on the temperature of the fresh air.

In some other implementations of this application, the temperature sensor is configured to monitor the temperature of the fresh air that enters the heat exchanger through the air intake vent A, the temperature of the air exhaust vent B, the temperature of the air intake vent C, and the temperature of the air exhaust vent D, and the controller is further configured to:

when the temperature of the air intake vent A is lower than the temperature of the air intake vent C, and the temperature of the air exhaust vent B is higher than the temperature of the air intake vent A or the temperature of the air intake vent C is higher than the temperature of the air exhaust vent D, control the opening degree of the bypass vent valve to be 0, where the temperature of the air intake vent A is obtained based on the temperature of the fresh air. When the temperature of the outdoor air is lower than the temperature of the indoor air, the bypass vent valve is controlled to be closed, so that the indoor air can be refrigerated to a greater extent by using the heat exchanger, to reduce energy consumption of the cooling system.

In some implementations of this application, the controller is further configured to:

when the temperature of the air intake vent A is lower than the temperature of the air intake vent C, control the opening degree of the first air valve to be 100%.

In some other implementations of this application, the controller is further configured to:

when the temperature of the air intake vent A is lower than the temperature of the air intake vent C, and the temperature of the air exhaust vent B is higher than the temperature of the air intake vent A or the temperature of the air intake vent C is higher than the temperature of the air exhaust vent D, control the opening degree of the first air valve to be 100%. When the temperature of the outdoor air is lower than the temperature of the indoor air, the first air valve is controlled to be completely opened, so that the indoor air can be refrigerated to a maximum extent by using the heat exchanger, to reduce energy consumption of the cooling system.

In an implementation of this application, the cooling system further includes a spraying apparatus, and the spraying apparatus is configured to cool the outdoor fresh air that is to enter the heat exchanger through the air intake vent A. After the outdoor fresh air enters the cooling system, the temperature of the outdoor fresh air decreases after the outdoor fresh air passes through the spraying apparatus, so as to provide a greater cooling capacity and better cool the indoor return air that passes through the heat exchanger. In an implementation of this application, the spraying apparatus is connected to the controller, and the controller is configured to control on/off of the spraying apparatus.

In some implementations of this application, the spraying apparatus includes a spraying component, and the spraying component is configured to spray water on the outdoor fresh air that is to enter the heat exchanger through the air intake vent A for cooling. In some other implementations of this application, the spraying apparatus includes a spraying component and a wet film, the spraying component is configured to spray water on the wet film, and the wet film cools the outdoor fresh air that passes.

In an implementation of this application, the temperature sensor includes a first temperature sensor and a second temperature sensor, the first temperature sensor is configured to monitor the temperature of the fresh air that enters the heat exchanger through the air intake vent A, and the second temperature sensor is configured to monitor the temperature of the air exhaust vent B.

In an implementation of this application, the first temperature sensor is disposed between the spraying apparatus and the heat exchanger, and the temperature of the fresh air that is monitored by the first temperature sensor is the temperature of the air intake vent A. The temperature of the air intake vent A may be directly and accurately obtained by disposing the first temperature sensor between the spraying apparatus and the heat exchanger.

In another implementation of this application, the first temperature sensor is disposed on a side that is of the spraying apparatus and that is away from the heat exchanger, and when the spraying apparatus is turned on, a difference between the temperature of the fresh air that is monitored by the first temperature sensor and a temperature that can be lowered for the outdoor fresh air by the spraying apparatus is the temperature of the air intake vent A. The first temperature sensor is disposed on the side that is of the spraying apparatus and that is away from the heat exchanger, so that impact of wet air that passes through the spraying apparatus on the first temperature sensor is avoided as much as possible.

In an implementation of this application, the temperature sensor includes a third temperature sensor and a fourth temperature sensor, the third temperature sensor is configured to monitor the temperature of the air intake vent C, and the fourth temperature sensor is configured to monitor the temperature of the air exhaust vent D.

In an implementation of this application, the controller is further configured to control on/off of the cooling supplement component based on the temperature of the air intake vent C. The cooling supplement component is connected to the controller.

In an implementation of this application, that the controller controls the cooling supplement component to turn on specifically includes:

when the temperature of the air intake vent C is higher than or equal to a preset threshold, controlling the cooling supplement component to turn on, so that the cooling supplement component is in a working state. The cooling supplement component can perform mechanical refrigeration. The cooling supplement component may be turned on, so that the cooling supplement component can perform combined refrigeration together with indirect evaporative cooling of the heat exchanger to compensate for a problem that the indirect evaporative cooling cannot meet a cooling capacity requirement. The preset threshold may be set according to a specific temperature requirement of the indoor space.

In an implementation of this application, the cooling system further includes a first fan disposed in the exhaust air pipe, and the first fan is configured to blow, into the condenser, air in the exhaust air pipe. The first fan may blow, into the condenser, air discharged from the air exhaust vent B, accelerate circulation of the outdoor air in the cooling system, and accelerate cooling and heat dissipation of the cooling system.

In an implementation of this application, the cooling system further includes a second fan disposed between the heat exchanger and the evaporator, and the second fan is configured to blow, into the evaporator, air discharged from the air exhaust vent D. The second fan may be disposed to accelerate circulation of the indoor return air in the cooling system, and accelerate cooling and heat dissipation of the cooling system.

In an implementation of this application, the cooling system further includes a filter disposed between the heat exchanger and the evaporator, and the filter is configured to filter air discharged from the air exhaust vent D. The filter can be disposed to ensure cleanliness of air in the equipment room or the cabinet.

In an implementation of this application, when the cooling system is configured to perform cooling and heat dissipation on indoor space such as the equipment room or the cabinet, the air intake vent C and the air exhaust vent D of the heat exchanger communicate with the indoor space.

According to the cooling system provided in the first aspect of the embodiments of this application, the temperature sensor is used to monitor and obtain the temperatures of the air intake vents and the air exhaust vents of the heat exchanger, and the opening degree of the bypass vent valve or the opening degrees of the bypass vent valve and the first air valve are adjusted at the same time, so that reverse heating of the heat exchanger can be effectively suppressed, cooling capacity attenuation is suppressed, and the cooling system can better perform heat dissipation on the indoor space having heat dissipation requirements, such as the equipment room or the cabinet in the data center.

A second aspect of the embodiments of this application further provides a cooling system. The cooling system includes a heat exchanger, a cooling supplement component, a first air valve, a temperature sensor, a spraying apparatus, and a controller.

The heat exchanger includes an air intake vent A and an air exhaust vent B that are used for outdoor fresh air entry and discharge, and an air intake vent C and an air exhaust vent D that are used for indoor return air entry and discharge; the cooling supplement component includes a condenser and an evaporator, the condenser is connected to the air exhaust vent B, and the evaporator is connected to the air exhaust vent D; the first air valve is disposed in a fresh air pipe communicating with the air intake vent A, and the fresh air pipe communicates with outdoor air; the spraying apparatus is disposed between the first air valve and the heat exchanger, and is configured to cool outdoor fresh air that is to enter the heat exchanger; and the first air valve and the temperature sensor are connected to the controller.

The temperature sensor is configured to monitor a temperature of fresh air that enters the heat exchanger through the air intake vent A and a temperature of the air exhaust vent B, or is configured to monitor a temperature of the air intake vent C and a temperature of the air exhaust vent D; and the controller is configured to control the first air valve based on the temperature of the fresh air and the temperature of the air exhaust vent B or based on the temperature of the air intake vent C and the temperature of the air exhaust vent D.

According to the cooling system in this embodiment of this application, indoor air may be cooled through combined refrigeration of indirect evaporative cooling of the heat exchanger and the cooling supplement component. In addition, when reverse heating occurs on the heat exchanger, an opening degree of the first air valve can be controlled to suppress reverse heating of the heat exchanger and effectively suppress cooling capacity attenuation. The cooling system may be configured to perform heat dissipation in an equipment room or a cabinet in a data center, can be adapted to various outdoor temperature conditions, and can better perform heat dissipation on an electronic device in the equipment room or the cabinet when a temperature of the outdoor air is relatively high. The cooling system may also be configured to perform heat dissipation in other indoor space having cooling and heat dissipation requirements.

In an implementation of this application, the controller is specifically configured to:

when the cooling supplement component is in a working state, the spraying apparatus is turned on, and the temperature of the air intake vent A is higher than the temperature of the air exhaust vent B or the temperature of the air intake vent C is lower than the temperature of the air exhaust vent D, control an opening degree of the first air valve to decrease, where the temperature of the air intake vent A is obtained based on the temperature of the fresh air. Because a capability of cooling the outdoor fresh air by using a spraying apparatus is limited, a higher flow rate of the fresh air leads to a lower temperature that can be reduced, and a lower flow rate of the fresh air leads to a higher temperature that can be reduced. When the cooling supplement component is in the working state, and the reverse heating phenomenon occurs in the heat exchanger, the opening degree of the first air valve may be controlled to decrease, so that the flow rate of the fresh air can be reduced, which helps reduce the temperature of the outdoor fresh air as much as possible before the outdoor fresh air enters the heat exchanger, suppress reverse heating, and also reduce energy consumption of the cooling supplement component.

In an implementation of this application, the temperature sensor is configured to monitor the temperature of the fresh air that enters the heat exchanger through the air intake vent A and the temperature of the air intake vent C, and the controller is further configured to:

when the temperature of the air intake vent A is lower than the temperature of the air intake vent C, control the opening degree of the first air valve to be 100%, where the temperature of the air intake vent A is obtained based on the temperature of the fresh air.

In an implementation of this application, the temperature sensor is configured to monitor the temperature of the fresh air that enters the heat exchanger through the air intake vent A, the temperature of the air exhaust vent B, the temperature of the air intake vent C, and the temperature of the air exhaust vent D, and the controller is further configured to:

when the temperature of the air intake vent A is lower than the temperature of the air intake vent C, and the temperature of the air exhaust vent B is higher than the temperature of the air intake vent A or the temperature of the air intake vent C is higher than the temperature of the air exhaust vent D, control the opening degree of the first air valve to be 100%, where the temperature of the air intake vent A is obtained based on the temperature of the fresh air. When the temperature of the outdoor air is lower than the temperature of the indoor air, the first air valve is controlled to be completely opened, so that the indoor air can be refrigerated to a maximum extent by using the heat exchanger, to reduce energy consumption of the cooling system.

In an implementation of this application, the temperature sensor includes a first temperature sensor and a second temperature sensor, the first temperature sensor is configured to monitor the temperature of the fresh air that enters the heat exchanger through the air intake vent A, and the second temperature sensor is configured to monitor the temperature of the air exhaust vent B.

In an implementation of this application, the first temperature sensor is disposed between the spraying apparatus and the heat exchanger, and the temperature of the fresh air that is monitored by the first temperature sensor is the temperature of the air intake vent A.

In an implementation of this application, the first temperature sensor is disposed on a side that is of the spraying apparatus and that is away from the heat exchanger, and when the spraying apparatus is turned on, a difference between the temperature of the fresh air that is monitored by the first temperature sensor and a temperature that can be lowered for the outdoor fresh air by the spraying apparatus is the temperature of the air intake vent A.

In an implementation of this application, the temperature sensor includes a third temperature sensor and a fourth temperature sensor, the third temperature sensor is configured to monitor the temperature of the air intake vent C, and the fourth temperature sensor is configured to monitor the temperature of the air exhaust vent D.

In some implementations of this application, the cooling system further includes a bypass vent valve, the bypass vent valve is disposed on an exhaust air pipe between the heat exchanger and the condenser, the bypass vent valve communicates with the outdoor air, and the bypass vent valve is connected to the controller.

The controller is configured to control the bypass vent valve based on the temperature of the fresh air and the temperature of the air exhaust vent B or based on the temperature of the air intake vent C and the temperature of the air exhaust vent D. The bypass vent valve is further disposed, so that reverse heating can be better suppressed and a cooling capacity requirement of the equipment room or the cabinet in the data center can be better met.

In an implementation of this application, the cooling system further includes a first fan disposed in the exhaust air pipe, and the first fan is configured to blow, into the condenser, air in the exhaust air pipe. The first fan may blow, into the condenser, air discharged from the air exhaust vent B, accelerate circulation of the outdoor air in the cooling system, and accelerate cooling and heat dissipation of the cooling system.

In an implementation of this application, the cooling system further includes a second fan disposed between the heat exchanger and the evaporator, and the second fan is configured to blow, into the evaporator, air discharged from the air exhaust vent D. The second fan may be disposed to accelerate circulation of the indoor return air in the cooling system, and accelerate cooling and heat dissipation of the cooling system.

An embodiment of this application further provides a data center. The data center includes an electronic device disposed in an equipment room or a cabinet, and the cooling system according to the first aspect or the second aspect of the embodiments of this application. The cooling system is configured to perform cooling and heat dissipation on the electronic device. When the cooling system is installed in the equipment room or the cabinet, the air intake vent C and the air exhaust vent D of the heat exchanger communicate with indoor space of the equipment room or the cabinet.

DESCRIPTION OF EMBODIMENTS

The following describes the embodiments of this application with reference to the accompanying drawings.

Figure 1:
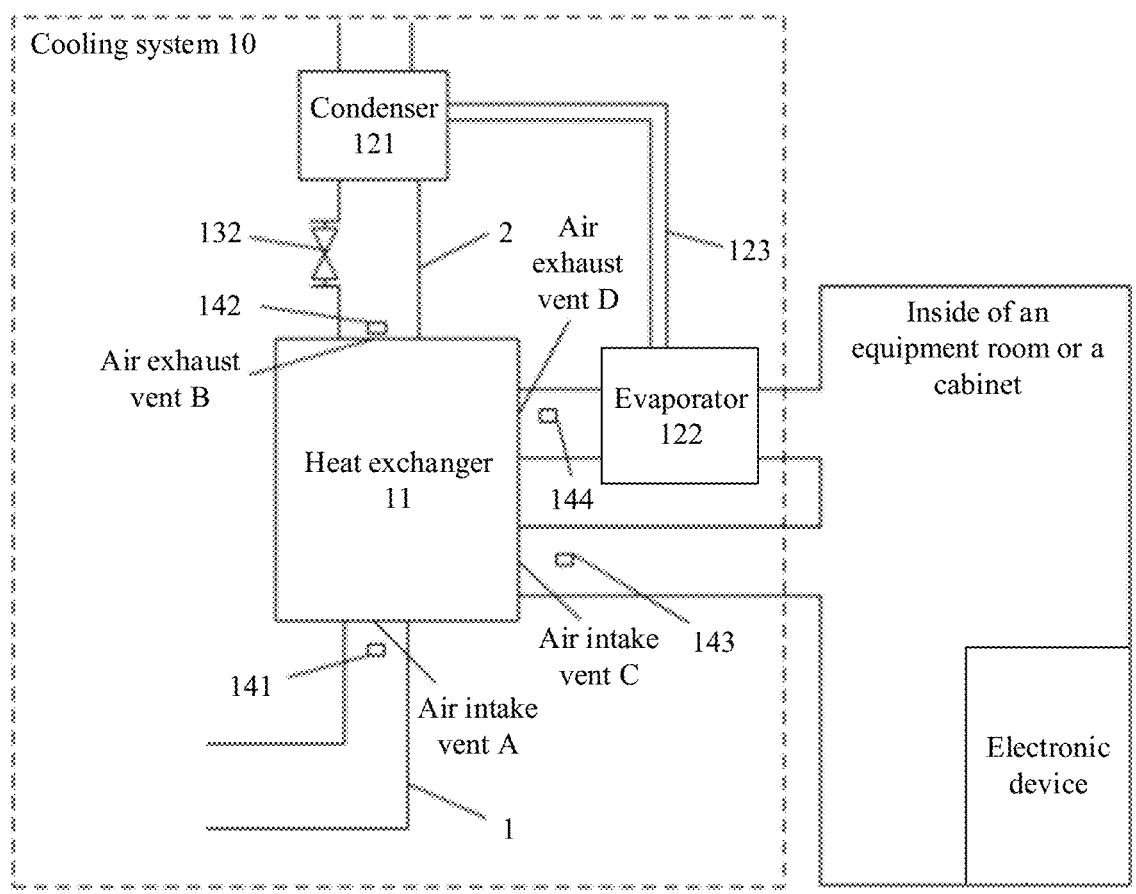
FIG. 1 is a schematic diagram of a structure of a cooling system according to an embodiment of this application.

Refer to FIG. 1. An embodiment of this application provides a cooling system 10. The cooling system 10 includes a heat exchanger 11, a cooling supplement component, a bypass vent valve 132, a temperature sensor, and a controller (not shown in the figure).

The heat exchanger 11 is provided with an air intake vent A and an air exhaust vent B that are used for outdoor fresh air entry and discharge, and is provided with an air intake vent C and an air exhaust vent D that are used for indoor return air entry and discharge. The air intake vent A communicates with outdoor air by using a fresh air pipe 1. The cooling supplement component includes a condenser 121 and an evaporator 122. The condenser 121 is connected to the air exhaust vent B by using an exhaust air pipe 2, and the evaporator 122 is connected to the air exhaust vent D. The condenser 121 communicates with the evaporator 122 by using a first pipe 123. The bypass vent valve 132 is disposed on the exhaust air pipe 2 between the heat exchanger 11 and the condenser 121, and the bypass vent valve 132 communicates with the outdoor air. The temperature sensor includes a first temperature sensor 141, a second temperature sensor 142, a third temperature sensor 143, and a fourth temperature sensor 144. The first temperature sensor 141 is configured to monitor a temperature of fresh air that is to enter the heat exchanger 11 through the air intake vent A, the second temperature sensor 142 is configured to monitor a temperature of the air exhaust vent B, the third temperature sensor 143 is configured to monitor a temperature of the air intake vent C, and the fourth temperature sensor is configured to monitor a temperature of the air exhaust vent D. The heat exchanger 11, the cooling supplement component, the bypass vent valve 132, the first temperature sensor 141, the second temperature sensor 142, the third temperature sensor 143, and the fourth temperature sensor 144 are all electrically connected to the controller. The controller is configured to control the bypass vent valve 132.

In this application, that the cooling system 10 is configured to perform heat dissipation in an equipment room or a cabinet in a data center is used as an example. "Outdoor" means the outside of the equipment room or the cabinet, "outdoor air" means air outside the equipment room or the cabinet, and "outdoor fresh air" is air that enters the cooling system from the outdoor. "Indoor" means the inside of the equipment room or the cabinet, "indoor air" means air inside the equipment room or the cabinet, and "indoor return air" means air that enters the cooling system from the indoor. The equipment room or the cabinet can be provided with various devices, for example, a heat generating device such as a server, and these devices generate heat in a working process.

In this implementation of this application, the cooling system 10 may implement indirect evaporative cooling by using the heat exchanger 11, and a heat exchanger unit is an indirect evaporative cooling unit. Specifically, a first air duct is formed between the air intake vent A and the air exhaust vent B of the heat exchanger 11, a second air duct is formed between the air intake vent C and the air exhaust vent D, and the first air duct and the second air duct are separated from each other. The air intake vent A and the air exhaust vent B of the first air duct communicate with outdoor air outside the equipment room or the cabinet. The first air duct is used for the outdoor air to flow through the heat exchanger 11. The outdoor air enters through the air intake vent A and is discharged from the air exhaust vent B. The air intake vent C and the air exhaust vent D of the second air duct communicate with the equipment room or the cabinet. The second air duct is used for indoor air inside the equipment room or the cabinet to flow through the heat exchanger. The indoor air enters through the air intake vent C, and is discharged from the air exhaust vent D into the equipment room or the cabinet. Heat exchange occurs between the outdoor air in the first air duct and the indoor air in the second air duct when the outdoor air and the indoor air flow through the heat exchanger, and the heat exchange occurs between indoor hot air and outdoor cool air and then the temperature decreases, so that outdoor air can be used to perform cooling and heat dissipation in the equipment room or the cabinet. This process is an indirect evaporative cooling process. However, when the temperature sensor detects that the temperature of the air intake vent A is higher than the temperature of the air exhaust vent B or the temperature of the air intake vent C is lower than the temperature of the air exhaust vent D, it indicates that indoor air passing through the heat exchanger is subjected to reverse heating by outdoor air passing through the heat exchanger, that is, indirect evaporative cooling fails. When it is detected that the temperature of the air intake vent A is lower than or equal to the temperature of the air exhaust vent B or the temperature of the air intake vent C is higher than or equal to the temperature of the air exhaust vent D, it indicates that the reverse heating phenomenon disappears.

In an implementation of this application, the temperature of the air intake vent A represents an air intake temperature of the air intake vent A, that is, a temperature of air that enters the heat exchanger 11 through the air intake vent A. The temperature of the air intake vent A may be obtained based on a temperature, monitored by the temperature sensor, of fresh air that enters the heat exchanger through the air intake vent A. The temperature of the air exhaust vent B represents an air exhaust temperature of the air exhaust vent B, that is, a temperature of air discharged from the air exhaust vent B of the heat exchanger 11. The temperature of the air intake vent C represents an air intake temperature of the air intake vent C, that is, a temperature of the indoor return air that enters the heat exchanger 11 through the air intake vent C. The temperature of the air exhaust vent D represents an air exhaust temperature of the air exhaust vent D, that is, a temperature of air discharged from the air exhaust vent D of the heat exchanger 11.

In the cooling system in this embodiment of this application, when a cooling capacity provided through indirect evaporative cooling of the heat exchanger 11 is insufficient, air that enters the room may be further cooled by using a cooling supplement component. That is, before air discharged from the air exhaust vent D enters the equipment room or the cabinet, the cooling supplement component may further cool the air discharged from the air exhaust vent D, so as to implement combined refrigeration of the heat exchanger and the cooling supplement component. Specifically, when the temperature of the air intake vent C monitored by the temperature sensor is higher than or equal to a preset threshold, it indicates that a cooling capacity provided by the heat exchanger 11 is insufficient, and the controller controls the cooling supplement component to be in a working state, that is, the cooling supplement component is turned on to supplement the cooling capacity by using the cooling supplement component. The preset threshold may be set based on a specific application temperature requirement of the equipment room or the cabinet. For example, the preset threshold may be 30° C., and the preset threshold 30° C. indicates that the indoor temperature requirement of the equipment room or the cabinet is kept at 30° C. If the indoor temperature cannot be kept at 30° C. by using the heat exchanger 11, it indicates that the cooling capacity provided by the heat exchanger is insufficient, and then the cooling supplement component needs to turn on. The temperature of the air intake vent C may be detected by the third temperature sensor 143. Optionally, the third temperature sensor 143 may be disposed at the air intake vent C, or may be disposed in a return air pipe communicating with the air intake vent C. A position of the third temperature sensor 143 in the return air pipe is not limited, provided that a temperature of return air of the air intake vent C can be accurately monitored.

Optionally, when the cooling capacity provided through indirect evaporative cooling of the heat exchanger 11 is sufficient, the cooling supplement component may not be required to perform cooperative cooling, so that the cooling supplement component may be stopped from working. In an implementation of this application, the controller may be further configured to: when the heat exchanger 11 can provide a sufficient cooling capacity, so that the temperature of the air intake vent C is stabilized at the preset threshold, control the cooling supplement component to be in an off state (that is, a non-working state). In another implementation of this application, the controller may be further configured to: when the heat exchanger 11 can provide a sufficient cooling capacity, and the temperature of the air intake vent C can be stabilized at the preset threshold even if the cooling supplement component is at a lowest load, control the cooling supplement component to be in an off state. The cooling supplement component is turned off, and refrigeration is performed only by using the heat exchanger 11. This can save resources and reduce refrigeration costs. The temperature of the air intake vent C is stabilized at the preset threshold. To be specific, the temperature is kept at the preset threshold within a time range t. The time range t may be set according to a specific condition, for example, may be 10 minutes.

In an implementation of this application, refer to FIG. 1. The cooling supplement component includes the condenser 121, the evaporator 122, and a compressor (not shown in the figure). The condenser 121 is connected to the evaporator 122 by using the first pipe 123, and the first pipe 123 includes a refrigerant. A low-temperature condensate liquid exchanges heat with external air by using the evaporator 122, and is gasified to absorb heat, so as to achieve a refrigeration effect. Specifically, in the cooling system 10 of this application, the evaporator 122 communicates with the air exhaust vent D. Specifically, an air intake vent of the evaporator 122 communicates with the air exhaust vent D of the heat exchanger 11. A low-temperature condensate liquid exchanges, by using the evaporator 122, heat with air discharged from the air exhaust vent D, and is gasified to absorb heat, so as to achieve an effect of refrigerating the air discharged from the air exhaust vent D. The condenser 121 is a heat exchanger, and may convert a gas or steam into a liquid and transfer heat to the air at a fast speed. A working process of the condenser 121 is a heat release process. Specifically, in the cooling system 10 of this application, the condenser 121 communicates with the air exhaust vent B. Specifically, an air intake vent of the condenser 121 communicates with the air exhaust vent B of the heat exchanger 11. Outdoor fresh air enters through the air intake vent A and is discharged from the air exhaust vent B after being heated up by the heat exchanger 11. A temperature of the heated air is still lower than that of the condenser 121. Air may be supplied to the condenser 121 to perform heat dissipation on the condenser 121. Heat released by the condenser 121 is absorbed by the air discharged from the air exhaust vent B, and is discharged together into the external air of the cooling system 10. The cooling supplement component inputs electrical energy through the compressor, so that heat is discharged from a low temperature environment to a high temperature environment. Setting of a position of the compressor is not limited. In an implementation of this application, the cooling supplement component may use an environment-friendly refrigerant, and the environment-friendly refrigerant is energy-efficient and environmentally friendly.

In an implementation of this application, when a temperature of the outdoor air is higher than a temperature of the indoor air, specifically, when the temperature of the air intake vent A is higher than the temperature of the return air of the air intake vent C, reverse heating is prone to occur in the heat exchanger 11. For an equipment room or a cabinet in a data center with the same cooling capacity requirement, the higher the temperature of the outdoor air, the more likely reverse heating occurs in the heat exchanger 11. The cooling system in this embodiment of this application may control the bypass vent valve to suppress reverse heating. Specifically, the controller is specifically configured to control the bypass vent valve 132 based on the temperature of the fresh air and the temperature of the air exhaust vent B, or based on the temperature of the air intake vent C and the temperature of the air exhaust vent D.

In an implementation of this application, when the cooling supplement component is in the working state, and the temperature of the air intake vent A of the heat exchanger 11 is higher than the temperature of the air exhaust vent B, the controller is configured to control an opening degree of the bypass vent valve 132 to increase. In another implementation of this application, when the cooling supplement component is in the working state, and the temperature of the air intake vent C is lower than the temperature of the air exhaust vent D, an opening degree of the bypass vent valve 132 is controlled to increase. In another implementation of this application, when the cooling supplement component is in the working state, the temperature of the air intake vent A of the heat exchanger 11 is higher than the temperature of the air exhaust vent B, and the temperature of the air intake vent C is lower than the temperature of the air exhaust vent D, an opening degree of the bypass vent valve 132 is controlled to increase.

In an implementation of this application, the bypass vent valve 132 is connected to the controller, and the opening degree of the bypass vent valve 132 is adjustable. Specifically, the opening degree of the bypass vent valve 132 may be adjusted from 0 to 100% (including 0 and 100%). The bypass vent valve 132 is opened, and the outdoor fresh air may enter the exhaust air pipe 2 through the bypass vent valve 132, and then enter the condenser 121. A larger opening degree of the bypass vent valve 132 causes more outdoor fresh air to enter the condenser 121 through the bypass vent valve 132. That is, the bypass vent valve 132 may be configured to regulate a volume of outdoor fresh air that enters the exhaust air pipe 2 through the bypass vent valve 132, that is, regulate a volume of outdoor fresh air that is introduced into the condenser 121 through the bypass vent valve 132. The exhaust air pipe 2 is connected to the air exhaust vent B of the heat exchanger 11. Therefore, a larger volume of fresh air that enters the exhaust air pipe 2 may better limit a volume of outdoor fresh air that enters through the air intake vent A of the heat exchanger 11 and is discharged from the air exhaust vent B, so as to suppress reverse-heating heat exchange of the heat exchanger 11, and suppress or avoid cooling capacity attenuation. In addition, the temperature of the outdoor fresh air introduced through the bypass vent valve 132 is higher than the temperature of the air exhaust vent B, so that power consumption of the cooling supplement component can be reduced.

In some implementations of this application, the opening degree of the bypass vent valve 132 is controlled to increase, and may be increased from a closed state whose opening degree is 0 to any target opening degree, or may be increased from an initial opening degree greater than 0 to any target opening degree. A final opening degree of the bypass vent valve 132 is not specifically limited. In an implementation, the opening degree of the bypass vent valve is controlled to increase until the temperature of the air intake vent A is lower than or equal to the temperature of the air exhaust vent B or the temperature of the air intake vent C is higher than or equal to the temperature of the air exhaust vent D. In this case, the opening degree of the bypass vent valve may be greater than 0 and lower than or equal to 100%. When the temperature of the air intake vent A is lower than or equal to the temperature of the air exhaust vent B or the temperature of the air intake vent C is higher than or equal to the temperature of the air exhaust vent D, the reverse heating phenomenon disappears. In some implementations, the opening degree of the bypass vent valve is controlled to increase to 100%. In some implementations of this application, when an outdoor temperature is relatively high, and reverse heating is severe, for example, when a difference between the temperature of the air intake vent A and the temperature of the air exhaust vent B is greater than a first threshold, or a difference between the temperature of the air exhaust vent D and the temperature of the air intake vent C is greater than the first threshold, the opening degree of the bypass vent valve is controlled to directly increase to 100%. When the opening degree of the bypass vent valve increases to 100%, reverse heating may disappear completely or may not disappear completely. In an implementation of this application, the opening degree of the bypass vent valve 132 is controlled to increase, and may directly increase to a target opening degree at a time, or may gradually increase to a target opening degree. The target opening degree may be any opening degree greater than 0 and lower than or equal to 100%.

In some implementations of this application, as shown in FIG. 1, the cooling system 10 is provided with only the bypass vent valve 132, and reverse heating of the heat exchanger 11 is suppressed by controlling the opening degree of the bypass vent valve 132. In an implementation of this application, when the temperature of the outdoor air is lower than the temperature of the indoor air, the heat exchanger 11 is in a normal indirect evaporative cooling working state, and when no reverse heating phenomenon occurs, the controller controls the opening degree of the bypass vent valve 132 to be 0, that is, to be in a closed state. Specifically, in an implementation of this application, the controller is further configured to: when the temperature of the air intake vent A is lower than the temperature of the air intake vent C, control the opening degree of the bypass vent valve 132 to be 0. When the temperature of the outdoor air is lower than the temperature of the indoor air, the bypass vent valve is controlled to be closed, so that the indoor air can be refrigerated to a greater extent by using the heat exchanger, to reduce energy consumption of the cooling system. In another implementation of this application, the controller is further configured to: when the temperature of the air intake vent A is lower than the temperature of the air intake vent C, and the temperature of the air exhaust vent B is higher than the temperature of the air intake vent A or the temperature of the air intake vent C is higher than the temperature of the air exhaust vent D, control the bypass vent valve 132 to be closed. By simultaneously comparing the temperature of the air intake vent A with the temperature of the air intake vent C, and comparing the temperature of the air intake vent A with the temperature of the air exhaust vent B, it can be more reliably determined that the heat exchanger 11 may be in the normal indirect evaporative cooling working state.

In an implementation of this application, a working process of the cooling system 10 provided with only the bypass vent valve 132 may include:

S101. A heat exchanger unit runs normally, and the opening degree of the bypass vent valve is 0. The controller obtains a temperature of the air intake vent C that is monitored by the third temperature sensor 143, and when the temperature of the air intake vent C is higher than or equal to the preset threshold, controls the cooling supplement component to turn on, so that the cooling supplement component is in the working state.

S102. The controller obtains the temperature of the air intake vent A based on the temperature of the fresh air that is monitored by the first temperature sensor 141, and obtains the temperature of the air exhaust vent B that is monitored by the second temperature sensor 142. When the temperature of the air intake vent A is higher than the temperature of the air exhaust vent B, the controller controls the opening degree of the bypass vent valve 132 to gradually increase until the temperature of the air intake vent A is lower than or equal to the temperature of the air exhaust vent B, and then fixes the opening degree of the bypass vent valve 132, or controls the opening degree of the bypass vent valve 132 to gradually increase until the opening degree of the bypass vent valve 132 is 100%.

S103. The cooling supplement component works normally, and continuously monitors the temperature of the fresh air that is to enter the heat exchanger through the air intake vent A, the temperature of the air exhaust vent B, and the temperature of the air intake vent C. When the temperature of the air intake vent A is lower than the temperature of the air intake vent C, the controller controls the opening degree of the bypass vent valve 132 to be 0, or when the temperature of the air intake vent A is lower than the temperature of the air intake vent C, and the temperature of the air exhaust vent B is higher than the temperature of the air intake vent A, controls the opening degree of the bypass vent valve 132 to be 0.

A specific manner of controlling the opening degree of the bypass vent valve 132 to gradually increase is not limited. The opening degree may increase at a predetermined constant speed over time, may increase at an inconstant speed, or may increase by gradient. Step sizes of increase gradients may be equal or unequal. When a difference between the temperature of the air intake vent A and the temperature of the air exhaust vent B is relatively large, an increasing speed of the opening degree may be accelerated, or a step size may be increased. This may be specifically set based on actual application. In some implementations, the opening degree of the bypass vent valve 132 may not increase gradually, but the bypass vent valve 132 is directly opened from the closed state to the target opening degree, where the target opening degree is, for example, 80% and 100%.

In an implementation of this application, the opening degree of the bypass vent valve is controlled to gradually increase. Specifically, for example, after the opening degree of the bypass vent valve increases to a first opening degree, it is determined again, after a predetermined time elapses, whether the temperature of the air intake vent A is higher than the temperature of the air exhaust vent B or the temperature of the air intake vent C is lower than the temperature of the air exhaust vent D. If reverse heating still exists, the opening degree of the bypass vent valve increases to a second opening degree. It is determined again, after a predetermined time elapses, whether reverse heating exists. If reverse heating disappears, the opening degree of the bypass vent valve is fixed as the second opening degree.

Figure 2:
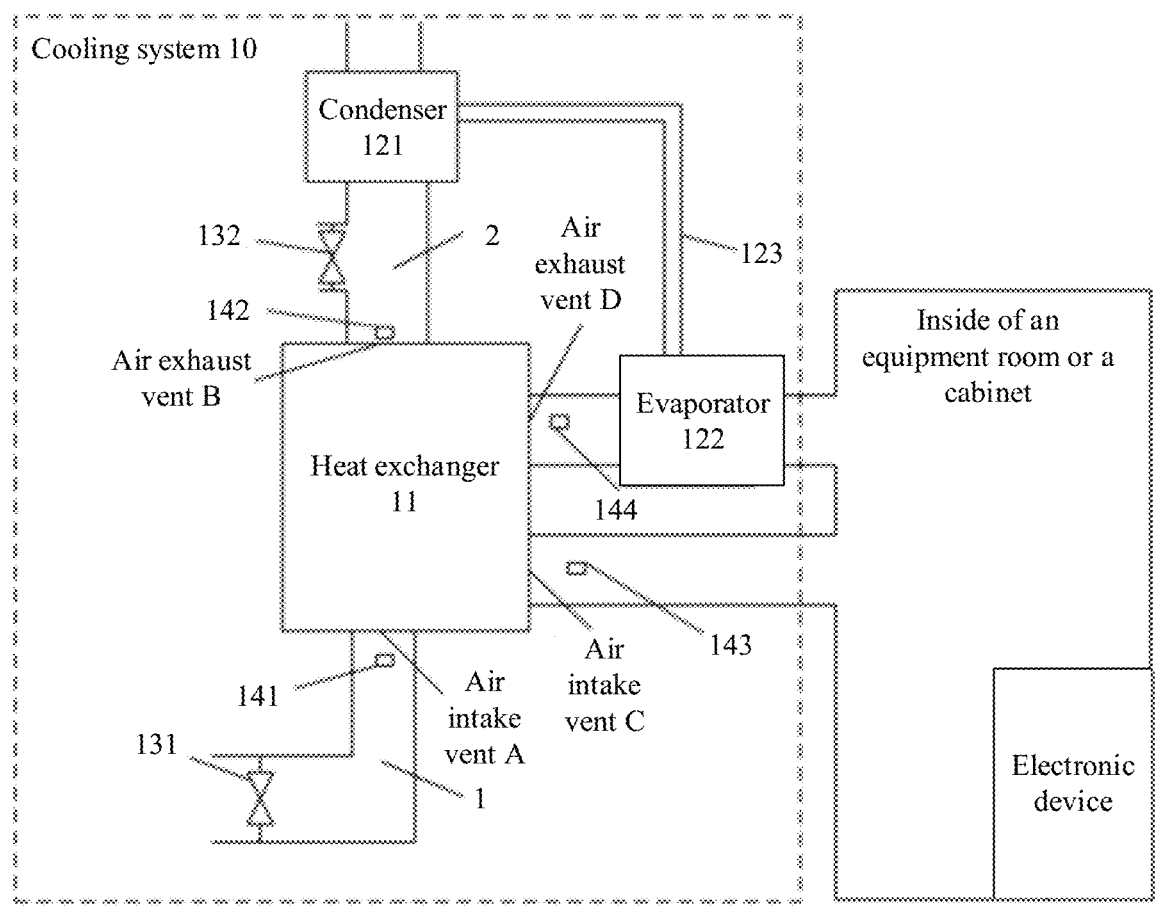
FIG. 2 is a schematic diagram of a structure of a cooling system according to another embodiment of this application.

Refer to FIG. 2. In some other implementations of this application, the cooling system 10 further includes a first air valve 131, that is, the cooling system 10 is provided with both the first air valve 131 and the bypass vent valve 132. The first air valve 131 is disposed in a fresh air pipe 1 that communicates with the air intake vent A, and the fresh air pipe 1 communicates with outdoor air. The first air valve 131 is connected to the controller, and an opening degree of the first air valve 131 is adjustable. Specifically, the opening degree of the first air valve 131 may be adjusted from 0 to 100% (including 0 and 100%). The first air valve 131 is configured to regulate a volume of outdoor fresh air that enters the fresh air pipe 1, that is, regulate a volume of outdoor fresh air that enters the heat exchanger 11.

In this implementation, the controller is further configured to control the first air valve 131 based on the temperature of the fresh air and the temperature of the air exhaust vent B, or based on the temperature of the air intake vent C and the temperature of the air exhaust vent D. In an implementation of this application, when the temperature of the air intake vent A is higher than the temperature of the air exhaust vent B, the opening degree of the first air valve 131 is controlled to decrease. In another implementation of this application, when the temperature of the air intake vent C is lower than the temperature of the air exhaust vent D, the opening degree of the first air valve 131 is controlled to decrease. In an implementation of this application, the heat exchanger 11 is in a normal indirect evaporative cooling working state, and when no reverse heating phenomenon occurs, the first air valve 131 is in state with an opening degree of 100%. When the reverse heating phenomenon occurs in the heat exchanger, the volume of fresh air that enters the heat exchanger from the fresh air pipe can be reduced by controlling the opening degree of the first air valve 131, and a resistance for the outdoor air of the bypass vent valve 132 to enter the exhaust air pipe can be reduced, which helps the outdoor air to enter the exhaust air pipe through the bypass vent valve, and further helps to suppress reverse heating of the heat exchanger. That is, when reverse heating occurs in the heat exchanger, the opening degree of the bypass vent valve 132 is controlled to increase, and at the same time, the opening degree of the first air valve 131 is controlled to decrease, so that reverse heating can be better suppressed. In an implementation of this application, the opening degree of the first air valve 131 is controlled to decrease, and may directly decrease to a target opening degree at a time, or may gradually decrease to a target opening degree. In some implementations of this application, when an outdoor temperature is relatively high, and reverse heating is severe, for example, when a difference between the temperature of the air intake vent A and the temperature of the air exhaust vent B is greater than a second threshold, or a difference between the temperature of the air exhaust vent D and the temperature of the air intake vent C is greater than the second threshold, the opening degree of the first air valve is controlled to directly decrease to 0.

When a reverse heating phenomenon occurs in the heat exchanger 11, a flow rate of the outdoor fresh air increases, that is, a volume of air that enters the heat exchanger 11 through the air intake vent A increases, and a reverse heating effect of the heat exchanger 11 becomes more severe. To maintain a sufficient cooling capacity, power consumption of the cooling supplement component increases, and the continuing of this state may cause a waste of resources of the cooling supplement component. To avoid continuous occurrence of the reverse heating phenomenon, the opening degree of the bypass vent valve 132 is regulated by the controller to increase, the bypass vent valve 132 is partially or completely opened, and outdoor fresh air is input from the bypass vent valve 132, and is directly delivered to the condenser 121. In addition, the opening degree of the first air valve 131 is regulated to decrease, and the first air valve 131 is partially or completely closed, so as to reduce a volume of fresh air that enters the heat exchanger 11 from the air intake vent A or completely block the fresh air, so as to suppress occurrence of reverse heating, and also reduce the power consumption of the cooling supplement component. When the first air valve 131 is completely closed (that is, the opening degree is 0), the outdoor fresh air does not need to pass through the heat exchanger 11 to cause reverse heating, that is, the heat exchanger 11 does not exchange heat, and refrigeration is performed only by using the cooling supplement component. Optionally, in some implementations, even if the bypass vent valve 132 and the first air valve 131 are both disposed in the cooling system, when the reverse heating phenomenon occurs, it may alternatively be the case that only the opening degree of the bypass vent valve 132 is regulated to increase, and the first air valve 131 is kept in a completely opened state.

In some implementations of this application, when the outdoor air temperature is relatively low, the opening degree of the bypass vent valve 132 may be controlled to be 0, and at the same time, the opening degree of the first air valve 131 may be controlled to be 100%. Specifically, in an implementation of this application, the controller is further configured to: when the temperature of the air intake vent A is lower than the temperature of the air intake vent C, control the opening degree of the bypass vent valve to be 0, and at the same time, control the opening degree of the first air valve 131 to be 100%. In another implementation, the controller is further configured to: when the temperature of the air intake vent A is lower than the temperature of the air intake vent C, and the temperature of the air exhaust vent B is higher than the temperature of the air intake vent A or the temperature of the air intake vent C is higher than the temperature of the air exhaust vent D, control the bypass vent valve to be 0, and control the first air valve 131 to be 100%.

In an implementation of this application, a working process of the cooling system 10 provided with both the first air valve 131 and the bypass vent valve 132 may include:

S201. A heat exchanger unit runs normally, the opening degree of the bypass vent valve is 0, and the opening degree of the first air valve is 100%. The controller obtains a temperature of the air intake vent C that is monitored by the third temperature sensor 143, and when the temperature of the air intake vent C is higher than or equal to the preset threshold, controls the cooling supplement component to turn on, so that the cooling supplement component is in the working state.

S202. The controller obtains the temperature of the air intake vent A based on the temperature of the fresh air that is monitored by the first temperature sensor 141, and obtains the temperature of the air exhaust vent B that is monitored by the second temperature sensor 142. When the temperature of the air intake vent A is higher than the temperature of the air exhaust vent B, the controller controls the opening degree of the bypass vent valve 132 to gradually increase and controls the opening degree of the first air valve 131 to decrease until the temperature of the air intake vent A is lower than or equal to the temperature of the air exhaust vent B, and then fixes the opening degrees of the first air valve 131 and the bypass vent valve 132, or controls the opening degree of the bypass vent valve 132 to gradually increase and controls the opening degree of the first air valve 131 to decrease until the opening degree of the bypass vent valve 132 is 100% and/or the opening degree of the first air valve is 0.

S203. The cooling supplement component works normally, and continuously monitors the temperature of the fresh air that is to enter the heat exchanger through the air intake vent A, the temperature of the air exhaust vent B, and the temperature of the air intake vent C. When the temperature of the air intake vent A is lower than the temperature of the air intake vent C, the controller controls the opening degree of the first air valve 131 to be 100%, and controls the opening degree of the bypass vent valve 132 to be 0, or when the temperature of the air intake vent A is lower than the temperature of the air intake vent C, and the temperature of the air exhaust vent B is greater than the temperature of the air intake vent A, controls the opening degree of the first air valve 131 to be 100%, and controls the opening degree of the bypass vent valve 132 to be 0.

A specific manner of controlling the opening degree of the bypass vent valve 132 to gradually increase is not limited. The opening degree may increase at a predetermined constant speed over time, may increase at an inconstant speed, or may increase by gradient. Step sizes of increase gradients may be equal or unequal. When a difference between the temperature of the air intake vent A and the temperature of the air exhaust vent B is relatively large, an increasing speed of the opening degree may be accelerated, or a step size may be increased. This may be specifically set based on actual application. Similarly, a specific manner of controlling the opening degree of the first air valve 131 to gradually decrease is not limited, either. The opening degree may decrease at a predetermined constant speed over time, may decrease at an inconstant speed, or may decrease by gradient.

In an implementation of this application, a specific structure of the bypass vent valve 132 and a specific structure of the first air valve 131 are not specifically limited, provided that the foregoing functions can be implemented.

Figure 3:
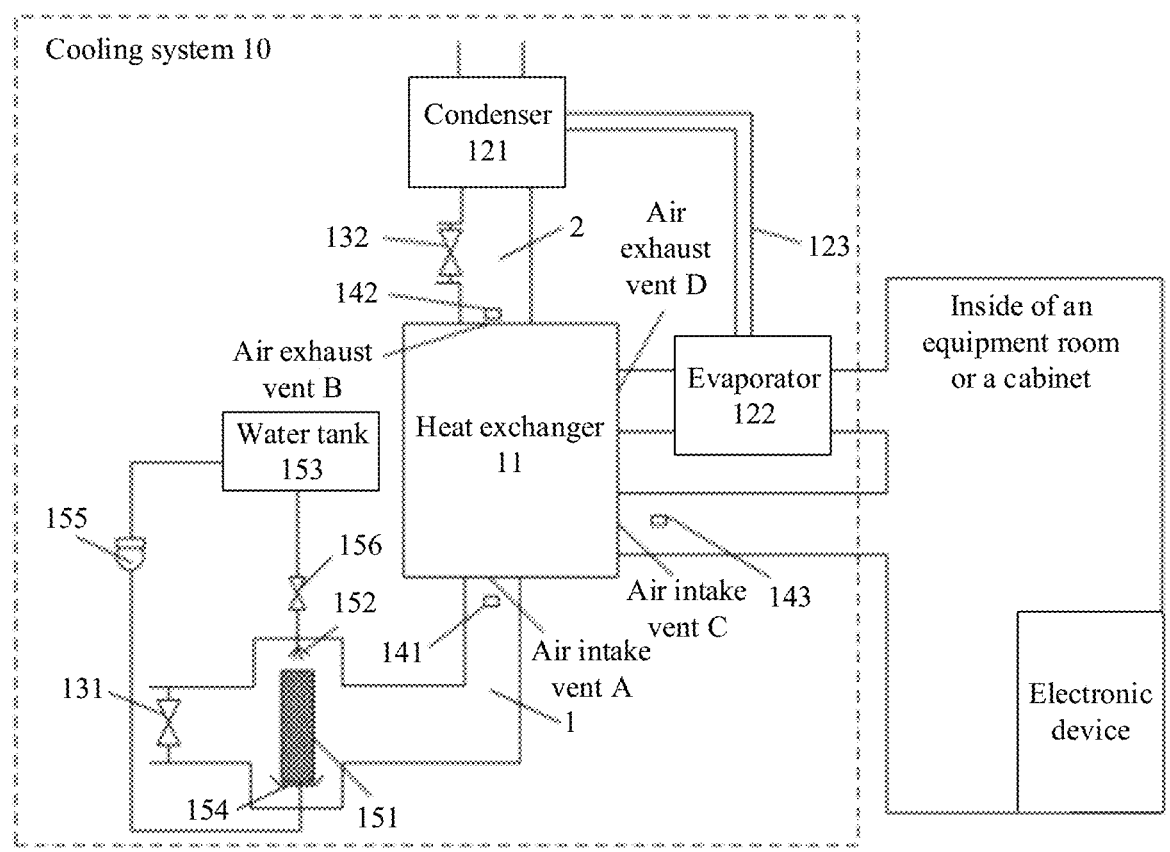
FIG. 3 is a schematic diagram of a structure of a cooling system according to still another embodiment of this application.

Refer to FIG. 3. In an implementation of this application, the cooling system 10 further includes a spraying apparatus, and the spraying apparatus is configured to cool outdoor fresh air that is to enter the heat exchanger 11. The spraying apparatus includes a wet film 151 and a spraying component 152. The wet film 151 is disposed at the air intake vent A of the heat exchanger 11. When the cooling system 10 includes the first air valve 131, the wet film 151 may be disposed between the first air valve 131 and the heat exchanger 11. The spraying component 152 is configured to spray water on the wet film 151. The spraying component 152 is connected to the controller, and the controller is configured to control on/off of the spraying component 152. Before the outdoor fresh air enters the air intake vent A, the wet film 151 that undergoes water spraying becomes wet air whose temperature is decreased. Therefore, if the outdoor fresh air needs to be cooled, the controller controls the spraying component 152 to turn on to spray water on the wet film 151, and if a temperature of the outdoor fresh air is relatively low and does not need to be decreased, the controller controls the spraying component 152 to turn off.

The wet film 151 may be made of a polymer material, and has extremely strong water absorption performance and a good self-cleaning capability. The wet film 151 has a relatively large surface area, and can provide a relatively large contact area between the outdoor fresh air and a surface of the wet film 151. When the outdoor fresh air passes through the wet film 151, moisture in the wet film 151 can fully absorb heat of the outdoor fresh air to vaporize and evaporate, so that the outdoor fresh air can be humidified and cooled. Therefore, after the outdoor fresh air that has been humidified and cooled by using the wet film 151 enters the heat exchanger 11, indirect evaporative cooling can be better performed on hot return air that is generated in the equipment room or the cabinet and that enters the heat exchanger through the air intake vent C. In some implementations of this application, the wet film 151 may alternatively not be disposed, but only the spraying component 152 is disposed to directly spray water to cool the outdoor fresh air. In contrast to a solution in which water is directly sprayed onto the outdoor fresh air, the water is sprayed onto the wet film 151, so that water for spraying can be reduced, and water scale generated by spraying water can be prevented from being brought into the heat exchanger by the outdoor fresh air. In an implementation of this application, a type of the wet film 151 is not limited, and may be a flat-plate type, a rotary type, or the like. The spraying component 152 may be but is not limited to a spraying nozzle, a spraying tube, or a spraying valve.

Still refer to FIG. 3. In an implementation of this application, the cooling system 10 further includes a water tank 153. Water in the water tank 153 is sprayed onto the wet film 151 by using the spraying component 152. The spraying component 152 is connected to the controller, and the controller may control spraying of the spraying component 152, a spraying speed, and the like. To better control water discharge of the spraying apparatus, a valve 156 may be disposed on a pipe between the water tank 153 and the spraying apparatus 152 to control opening and closing of the pipe. Further, a water plate 154 may be disposed below the wet film 151, a water pump 155 may be disposed on a pipe connected between the water tank 153 and the water plate 154, and the water pump 155 is configured to deliver water in the water plate 154 to the water tank 153. After the spraying component 152 sprays water onto the wet film 151, a part of water falls into the water plate 154 below the wet film 151. The water pump 155 is connected to the controller, and the controller may further control the water pump 155 to deliver water in the water plate 154 into the water tank 153 through a pipe, so that remaining water after spraying can be recycled, water resources are saved, and a water adding period of the water tank 153 is prolonged.

Figure 4:
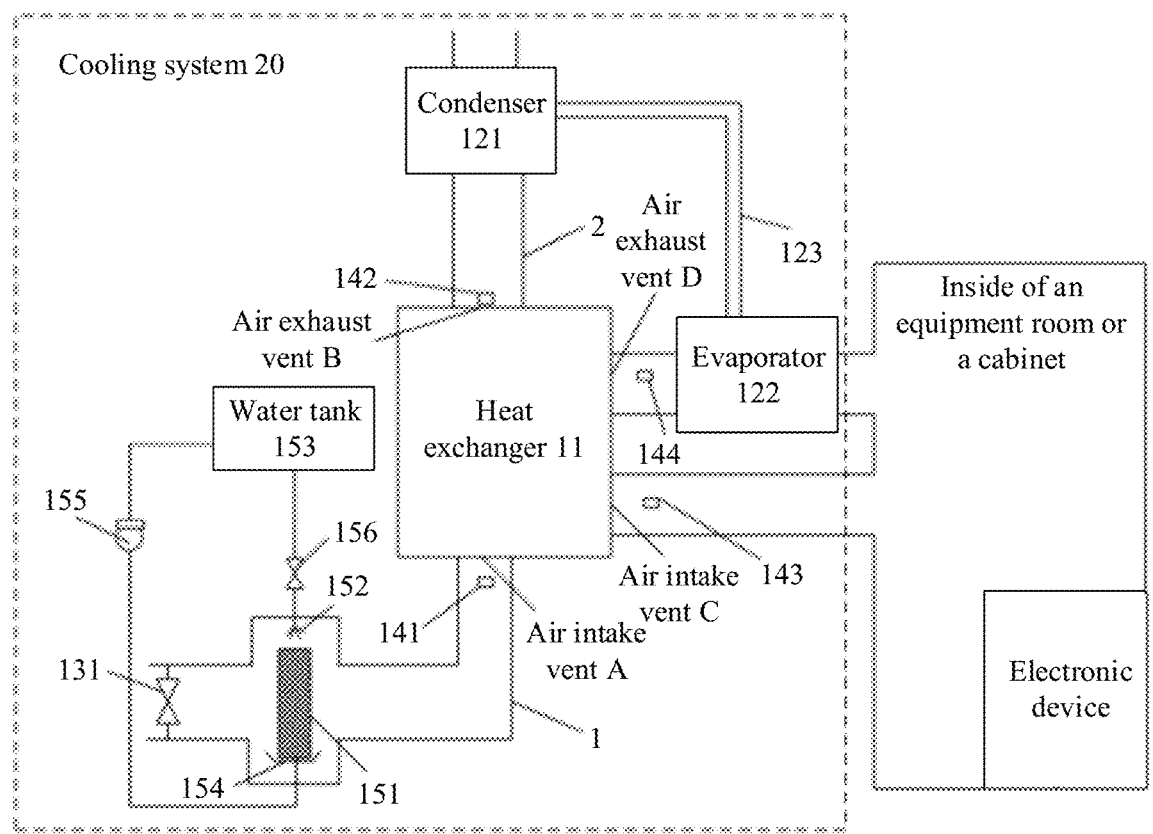
FIG. 4 is a schematic diagram of a structure of a cooling system according to still another embodiment of this application.

Refer to FIG. 4. An embodiment of this application further provides a cooling system 20. The cooling system 20 includes a heat exchanger 11, a cooling supplement component, a first air valve 131, a spraying apparatus, a temperature sensor, and a controller. The spraying apparatus is disposed between the first air valve 131 and the heat exchanger 11. That is, in this embodiment, the cooling system 20 is provided with only the first air valve 131 and is provided with no bypass vent valve. In some implementations, the spraying apparatus includes a wet film 151 and a spraying component 152. In some other implementations, the spraying apparatus includes only the spraying component 152. Because a capability of cooling the outdoor fresh air by using a spraying apparatus is limited, a higher flow rate of the fresh air leads to a lower temperature that can be reduced, and a lower flow rate of the fresh air leads to a higher temperature that can be reduced. Therefore, when the cooling supplement component is in a working state, and a reverse heating phenomenon occurs in the heat exchanger 11, to obtain cooled fresh air with a relatively low temperature, an opening degree of the first air valve 131 may be adjusted to decrease, to reduce a flow rate of fresh air that enters a fresh air pipe 1, so that a temperature of air before the air enters the heat exchanger 11 is decreased as much as possible, thereby effectively suppressing reverse heating.

In some implementations of this application, the controller is further configured to: when a temperature of an air intake vent A is lower than a temperature of an air intake vent C, control an opening degree of the first air valve 131 to be 100%, or when the temperature of the air intake vent A is lower than the temperature of the air intake vent C, and a temperature of an air exhaust vent B is higher than the temperature of the air intake vent A, control the opening degree of the first air valve 131 to be 100%.

In some implementations, the cooling system 20 may further include the bypass vent valve 132 disposed on the exhaust air pipe 2 between the heat exchanger 11 and the condenser 121. The bypass vent valve 132 communicates with outdoor air. In this case, the cooling system 20 is equivalent to the cooling system 10 provided with both the first air valve 131 and the bypass vent valve 132 in the foregoing embodiments. Components in the cooling system 20 are the same as those in the cooling system 10, and details are not described herein again.

In an implementation of this application, in a heat exchange process in which the heat exchanger 11 performs indirect evaporative cooling, an air path of outdoor air is as follows: Outdoor air carries moisture after passing through the wet film 151 that has been immersed in water, and then becomes low-temperature wet air. The low-temperature wet air enters the heat exchanger 11 from the air intake vent A, absorbs heat in the heat exchanger 11 and then is heated up, and becomes high-temperature wet air. The high-temperature wet air is then discharged from the air exhaust vent B of the heat exchanger 11, enters the condenser 121, then dissipates heat to the condenser 121, and is discharged to the outside of the cooling system 10. An air path of indoor air is as follows: Hot return air inside the equipment room or the cabinet enters the heat exchanger 11 from the air intake vent C of the heat exchanger 11. After heat is absorbed by the heat exchanger 11, the hot return air becomes cool air and is discharged from the air exhaust vent D of the heat exchanger 11, and the cool air enters the evaporator 122. After further cooling, the cool air returns to the equipment room or the cabinet. In the cooling system 10 in this embodiment of this application, in a process of cooling the equipment room or the cabinet, outdoor fresh air does not directly enter the equipment room or the cabinet, but only a cooling capacity of the outdoor fresh air is used. In this way, dust and impurities in the outdoor fresh air are prevented from being brought into the equipment room or the cabinet to cause pollution. In addition, the outdoor fresh air is not to increase humidity in the equipment room or the cabinet even if the outdoor fresh air has been humidified by using the wet film, thereby ensuring normal operating of an electronic device in the equipment room or the cabinet and prolonging a service life of the electronic device. This is applicable to an environment with a specific requirement for the humidity in the equipment room or the cabinet.

In an implementation of this application, the first temperature sensor 141 is disposed in the fresh air pipe 1, and is configured to monitor a temperature of fresh air that is to enter the heat exchanger through the air intake vent A. For a cooling system provided with no spraying apparatus, the temperature of the fresh air that is monitored by the first temperature sensor 141 is the temperature of the air intake vent A. For a cooling system in which a spraying apparatus is disposed and the spraying apparatus is turned on, the following two cases may exist by using an example that the spraying apparatus includes the spraying apparatus 152 and the wet film 151.

Refer to FIG. 3 and FIG. 4. In an implementation of this application, the first temperature sensor 141 is disposed between the wet film 151 and the heat exchanger 11. In this case, an air temperature monitored by the first temperature sensor 141 is a temperature of outdoor fresh air that has been cooled by using the wet film 151, that is, a temperature of the outdoor fresh air that enters the air intake vent A.

Figure 5:
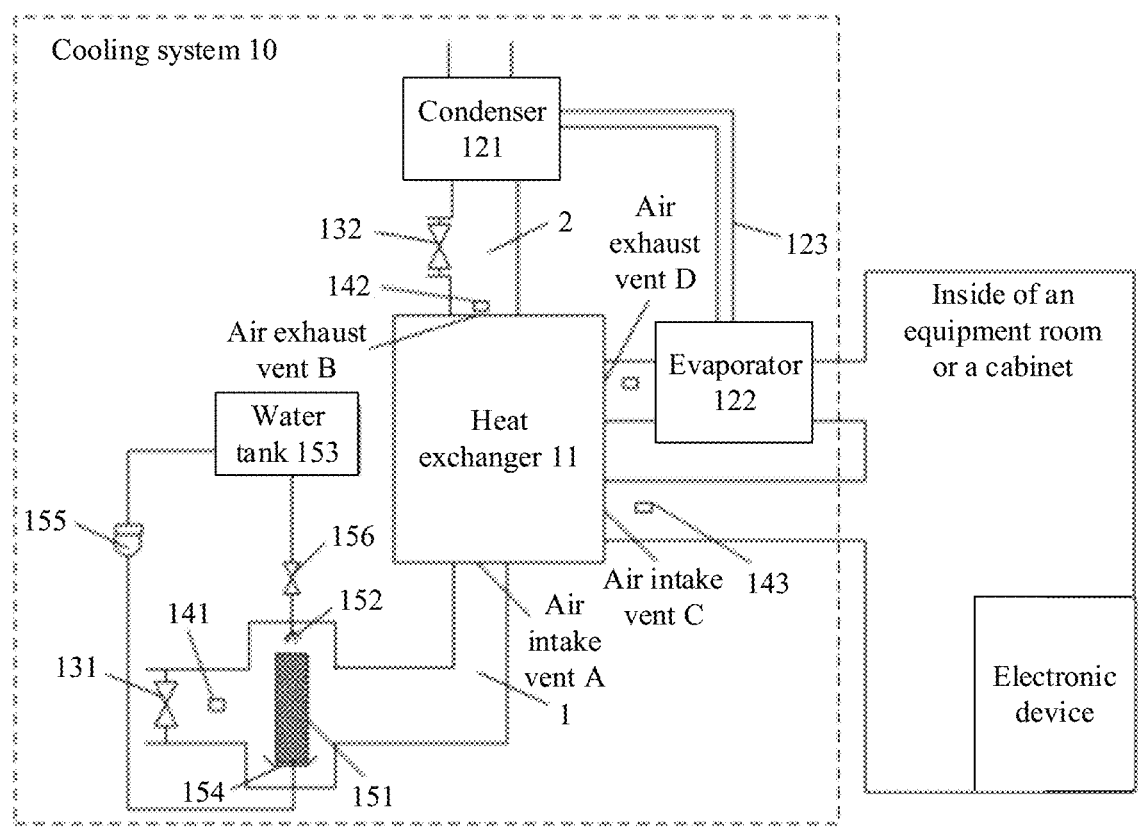
FIG. 5 is a schematic diagram of a structure of a cooling system according to still another embodiment of this application.

Refer to FIG. 5. In another implementation of this application, the first temperature sensor 141 is disposed on a side that is of the wet film 151 and that is away from the heat exchanger 11. In this case, an air temperature monitored by the first temperature sensor 141 is a temperature of outdoor fresh air that has not been cooled by using the wet film 151. In this implementation, a difference between the temperature of the fresh air that is monitored by the first temperature sensor 141 and a temperature of outdoor fresh air that can be decreased by using the wet film is the temperature of the air intake vent A. Specifically, the temperature monitored by the first temperature sensor 141 minus the temperature of the outdoor fresh air that can be decreased by using the wet film obtains the temperature of the air intake vent A. For example, if the temperature monitored by the first temperature sensor 141 is 25° C., and the temperature of the outdoor fresh air that can be decreased by using the wet film is 3° C., the temperature of the air intake vent A is 22° C. The temperature of the outdoor fresh air that can be decreased by using the wet film may be obtained based on spraying efficiency of the spraying apparatus 152. If the spraying apparatus is not turned on, the controller obtains the temperature monitored by the first temperature sensor, that is, the temperature of the air intake vent A.

In an implementation of this application, the second temperature sensor 142 is disposed in the air exhaust vent B, may be located in the exhaust air pipe 2 communicating with the air exhaust vent B, and is configured to monitor the temperature of the air exhaust vent B. The second temperature sensor 142 is disposed between the condenser 121 and the heat exchanger 11. When the cooling system 10 includes the bypass vent valve 132, the second temperature sensor 142 is disposed between the bypass vent valve 132 and the heat exchanger 11. That is, the temperature monitored by the second temperature sensor 142 is the temperature of the air exhaust vent B. In an implementation of this application, the fourth temperature sensor 144 is disposed in the air exhaust vent D, may be located in an exhaust air pipe between the evaporator 122 and the air exhaust vent D, and is configured to monitor the temperature of the air exhaust vent D. That is, the temperature monitored by the fourth temperature sensor 144 is a temperature of the air exhaust vent D.

Figure 6:
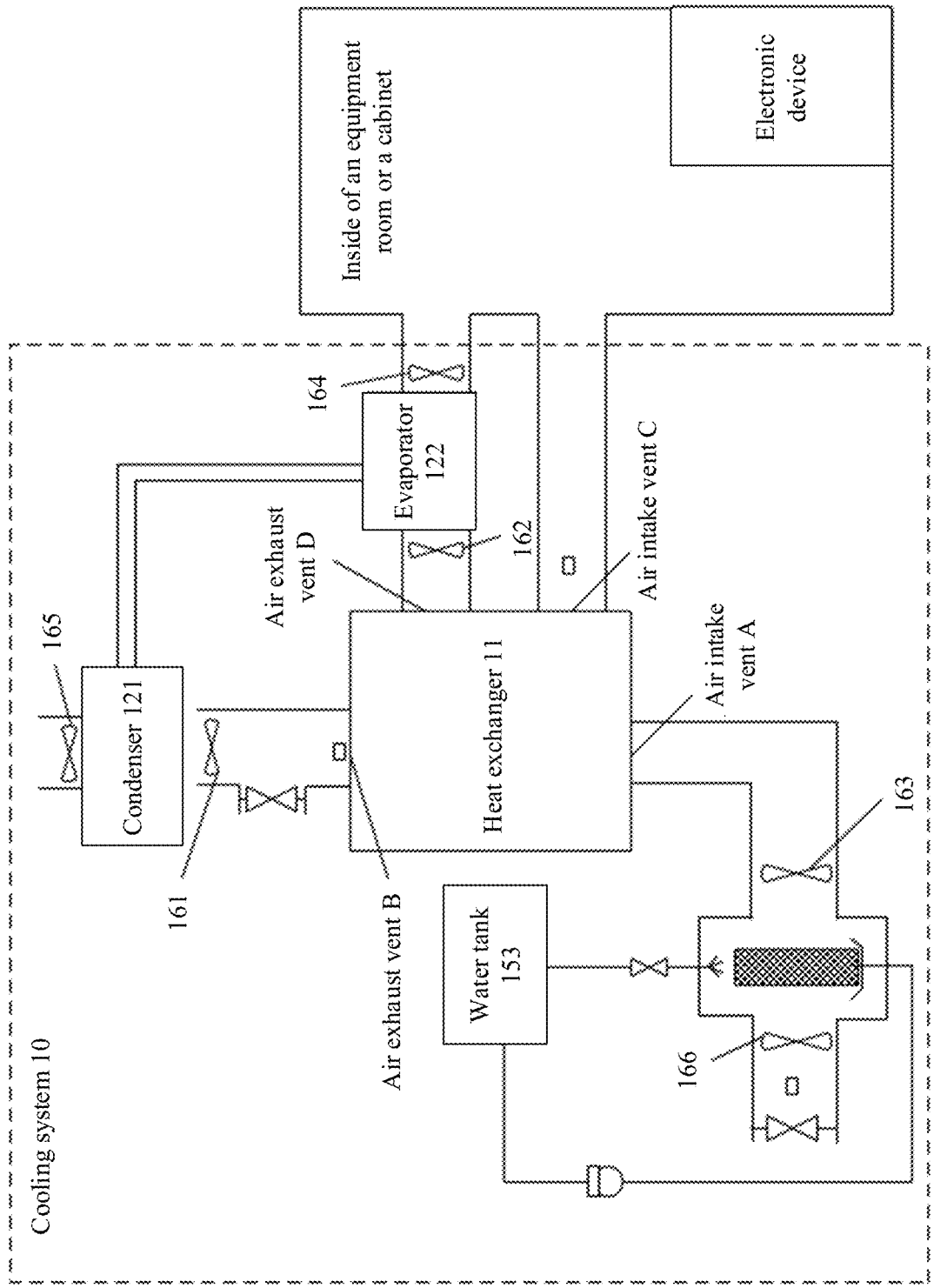
FIG. 6 is a schematic diagram of a structure of a cooling system according to still another embodiment of this application.

Refer to FIG. 6. In an implementation of this application, the cooling system 10 may further include a first fan 161 disposed at the air exhaust vent B, and the first fan 161 is configured to blow, into the condenser 121, air discharged from the air exhaust vent B, to accelerate air circulation and working of the condenser 121 and also accelerate circulation of outdoor air in the entire cooling system, and accelerate cooling and heat dissipation of the cooling system. The first fan 161 is disposed close to the condenser 121. When the cooling system 10 includes the bypass vent valve 132, the first fan 161 is disposed between the bypass vent valve 132 and the condenser 121.

In an implementation of this application, the cooling system 10 may further include a second fan 162 disposed at the air exhaust vent D, and the second fan 162 is configured to blow, into the evaporator 122, air discharged from the air exhaust vent D, to accelerate working of the evaporator 122. The second fan 162 may be disposed to accelerate circulation of the indoor return air in the cooling system, and accelerate cooling and heat dissipation of the cooling system.

In an implementation of this application, the cooling system 10 may further include a third fan 163 disposed at the air intake vent A, the third fan 163 is located between the heat exchanger 11 and the wet film 151, and the third fan 163 is configured to blow, into the heat exchanger 11, air that passes through the wet film 151.

In an implementation of this application, a fourth fan 164 may be further disposed on a side that is of the evaporator 122 and that is close to the equipment room or the cabinet, and the fourth fan 164 may be disposed to accelerate air that passes through the evaporator 122 to enter the equipment room or the cabinet.

In an implementation of this application, a fifth fan 165 may be further disposed on a side that is of the condenser 121 and that is away from the heat exchanger 11, and the fifth fan may be disposed to help air that passes through the condenser discharge to the outdoor.

In an implementation of this application, the cooling system 10 may further include a sixth fan 166 disposed at the air intake vent A, the sixth fan 166 is located on a side that is of the wet film 151 and that is away from the heat exchanger 11, and the sixth fan 166 is configured to blow outdoor fresh air into the wet film 151.

The controller is electrically connected to the first fan 161, the second fan 162, the third fan 163, the fourth fan 164, the fifth fan 165, and the sixth fan 166, and is configured to control on/off, rotation speeds, and the like of the foregoing fans. Specific types of the foregoing fans are not limited, and may be a centrifugal fan, an axial flow fan, a cross flow blower, or the like.

In an implementation of this application, the cooling system may further include a filter disposed at the air exhaust vent D, and the filter is configured to filter air discharged from the air exhaust vent D. The filter may be disposed on a side that is of the evaporator 122 and that is close to the heat exchanger 11, or may be disposed on a side that is of the evaporator 122 and that is away from the heat exchanger. The filter can be disposed to ensure cleanliness of air in the equipment room or the cabinet.

Figure 7:
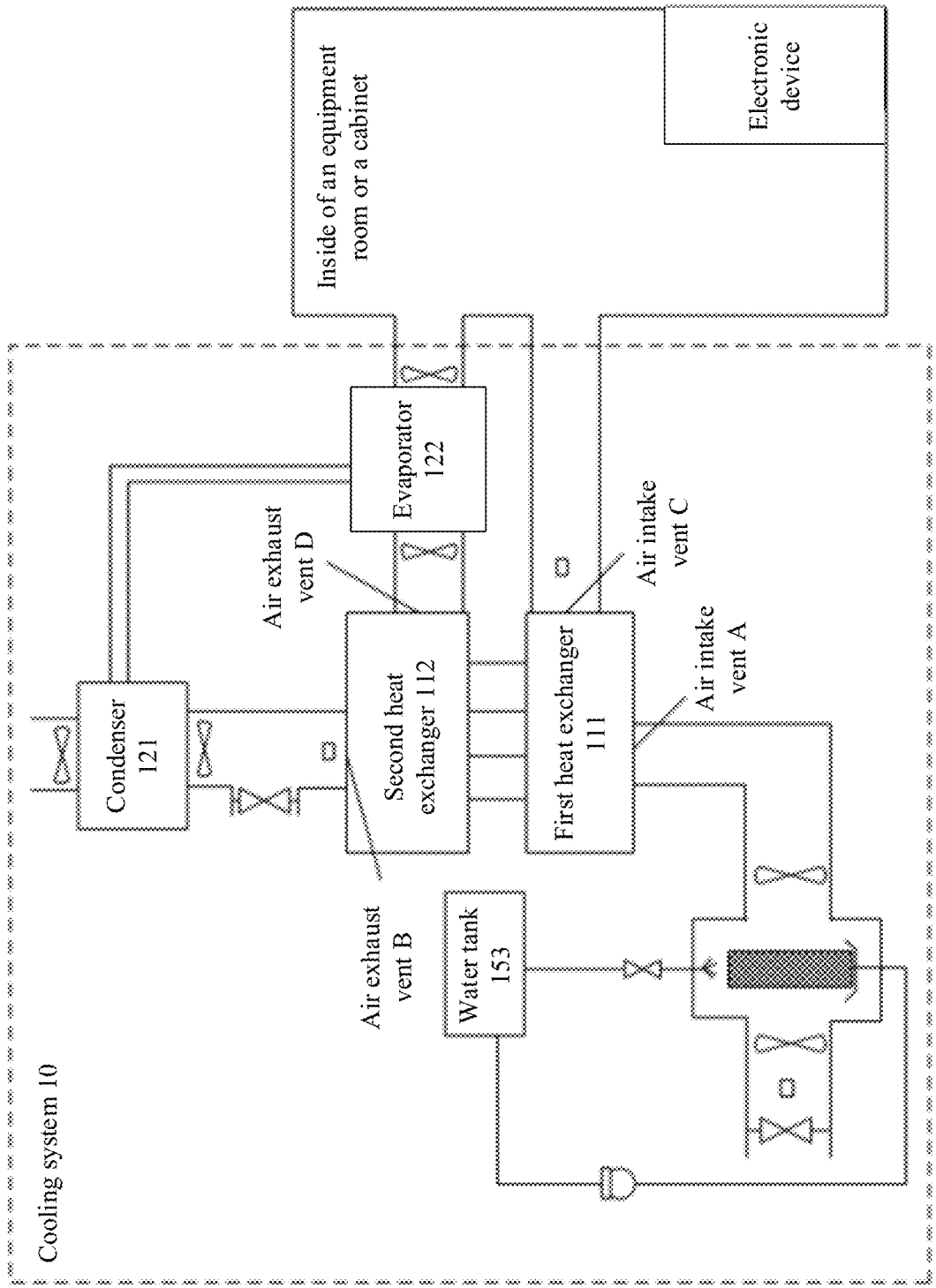
FIG. 7 is a schematic diagram of a structure of a cooling system according to still another embodiment of this application.

In an implementation of this application, there may be one heat exchanger 11, or a plurality of (two or more) heat exchangers that are connected in series. As shown in FIG. 7, the heat exchanger 11 includes a first heat exchanger 111 and a second heat exchanger 112 that are connected in series. In this embodiment, outdoor air enters the first heat exchanger 111 through the air intake vent A, and enters the second heat exchanger 112 after first heat exchange with the first heat exchanger 111, so as to perform second heat exchange. Finally, the air exhaust vent B discharges the outdoor air from the cooling system. Indoor air in the equipment room or the cabinet enters the first heat exchanger 111 through the air intake vent C. After first heat exchange with the first heat exchanger 111 is performed to implement cooling for the first time, the indoor air enters the second heat exchanger 112 to perform second heat exchange to implement cooling for the second time. Finally, the indoor air returns to the equipment room or the cabinet through the air exhaust vent D. A plurality of heat exchangers can exchange heat for a plurality of times, so that the indoor air in the equipment room or the cabinet can be cooled better.

In this implementation of this application, the controller is configured to control operation of components such as the heat exchanger, the bypass vent valve, the first air valve, the fan, the spraying apparatus, the water pump, the condenser, and the evaporator, and the controller is electrically connected to the components. The controller may be any controller such as a single-chip microcomputer, a programmable logic controller C (PLC), or a field-programmable gate array C (FPGA). The cooling system in this embodiment of this application may be used for heat dissipation in the equipment room or the cabinet in the data center, or may be used for heat dissipation in another equipment room or cabinet, such as a communications base station, an electronic workshop, or an industrial factory building.

Refer to FIG. 1 to FIG. 7. An embodiment of this application further provides a data center. The data center includes an electronic device disposed in an equipment room or a cabinet and the cooling system 10 or the cooling system 20 in the foregoing embodiments of this application. The cooling system is configured to perform cooling and heat dissipation on the electronic device. The data center performs heat dissipation on the electronic device by using the cooling system provided in the embodiments of this application, so as to effectively avoid a reverse heating phenomenon of an indirect evaporative cooling unit, and continuously cool air in the equipment room or the cabinet.

What is claimed is:

1. A cooling system, comprising:
 a heat exchanger;
 a cooling supplement component;
 a bypass vent valve;
 a temperature sensor; and
 a controller,
 wherein the heat exchanger comprises:
  an air intake vent A and an air exhaust vent B that are configured to be used for outdoor fresh air entry and discharge, respectively; and
  an air intake vent C and an air exhaust vent D that are configured to be used for indoor return air entry and discharge, respectively,
 wherein the cooling supplement component comprises:
  a condenser connected to the air exhaust vent B by using an exhaust air pipe; and
  an evaporator connected to the air exhaust vent D,
 wherein the bypass vent valve is disposed on the exhaust air pipe, and the bypass vent valve communicates with outdoor air,
 wherein the bypass vent valve is connected to the controller, and the controller is configured to control the bypass vent valve,
 wherein the temperature sensor is configured to monitor a temperature of fresh air that enters the heat exchanger through the air intake vent A and a temperature of the air exhaust vent B, or configured to monitor a temperature of the air intake vent C and a temperature of the air exhaust vent D, and
 wherein the controller is further configured to:
  control the bypass vent valve based on the temperature of the fresh air and the temperature of the air exhaust vent B or one of the temperature of the air intake vent C and the temperature of the air exhaust vent D.

2. The cooling system according to claim 1, wherein the cooling system further comprises a first air valve, the first air valve is disposed in a fresh air pipe communicating with the air intake vent A, and the fresh air pipe communicates with outdoor air; and the controller is further configured to control the first air valve.

3. The cooling system according to claim 2, wherein the controller is further configured to:
control the first air valve based on one of the temperature of the fresh air and the temperature of the air exhaust vent B or the temperature of the air intake vent C and the temperature of the air exhaust vent D.

4. The cooling system according to claim 3, wherein the controller is further configured to:
when the cooling supplement component is in the working state, and one of the temperature of the air intake vent A is higher than the temperature of the air exhaust vent B or the temperature of the air intake vent C is lower than the temperature of the air exhaust vent D, control an opening degree of the first air valve to decrease, wherein the temperature of the air intake vent A is obtained based on the temperature of the fresh air.

5. The cooling system according to claim 1, wherein the controller is further configured to:
when the cooling supplement component is in a working state, and a temperature of the air intake vent A is higher than the temperature of the air exhaust vent B or the temperature of the air intake vent C is lower than the temperature of the air exhaust vent D, control an opening degree of the bypass vent valve to increase, wherein the temperature of the air intake vent A is obtained based on the temperature of the fresh air.

6. The cooling system according to claim 1, wherein the temperature sensor is configured to monitor the temperature of the fresh air that enters the heat exchanger through the air intake vent A and the temperature of the air intake vent C, and the controller is further configured to:
when the temperature of the air intake vent A is lower than the temperature of the air intake vent C, control the opening degree of the bypass vent valve to be 0, wherein the temperature of the air intake vent A is obtained based on the temperature of the fresh air.

7. The cooling system according to claim 6, wherein the controller is further configured to:
when the temperature of the air intake vent A is lower than the temperature of the air intake vent C, control the opening degree of the first air valve to be 100%.

8. The cooling system according to claim 1, wherein the cooling system further comprises a spraying apparatus, and the spraying apparatus is configured to cool the outdoor fresh air that is to enter the heat exchanger through the air intake vent A.

9. The cooling system according to claim 8, wherein the temperature sensor comprises a first temperature sensor, and the first temperature sensor is configured to monitor the temperature of the fresh air that enters the heat exchanger through the air intake vent A.

10. The cooling system according to claim 9, wherein the first temperature sensor is disposed between the spraying apparatus and the heat exchanger, and the temperature of the fresh air that is monitored by the first temperature sensor is the temperature of the air intake vent A.

11. The cooling system according to claim 9, wherein the first temperature sensor is disposed on a side of the spraying apparatus that is away from the heat exchanger, and when the spraying apparatus is turned on, a difference between the temperature of the fresh air that is monitored by the first temperature sensor and a temperature that can be lowered for the outdoor fresh air by the spraying apparatus is the temperature of the air intake vent A.

12. The cooling system according to claim 1, wherein the cooling system further comprises a first fan disposed in the exhaust air pipe, and the first fan is configured to blow, into the condenser, air in the exhaust air pipe.

13. The cooling system according to claim 1, wherein the cooling system further comprises a fan disposed between the heat exchanger and the evaporator, and the fan is configured to blow, into the evaporator, air discharged from the air exhaust vent D.

14. A cooling system, comprising:
a heat exchanger;
a cooling supplement component;
a first air valve;
a temperature sensor;
a spraying apparatus; and
a controller,
wherein the heat exchanger comprises:
an air intake vent A and an air exhaust vent B that are configured to be used for outdoor fresh air entry and discharge; and
an air intake vent C and an air exhaust vent D that are configured to be used for indoor return air entry and discharge,
wherein the cooling supplement component comprises:
a condenser connected to the air exhaust vent B; and
an evaporator connected to the air exhaust vent D,
wherein the first air valve is disposed in a fresh air pipe communicating with the air intake vent A, and the fresh air pipe communicates with outdoor air,
wherein the spraying apparatus is disposed between the first air valve and the heat exchanger, and is configured to cool outdoor fresh air that is to enter the heat exchanger,
wherein the first air valve and the temperature sensor are connected to the controller,
wherein the temperature sensor is configured to monitor a temperature of fresh air that enters the heat exchanger through the air intake vent A and a temperature of the air exhaust vent B, or monitor a temperature of the air intake vent C and a temperature of the air exhaust vent D; and
wherein the controller is configured to control the first air valve based on the temperature of the fresh air and the temperature of the air exhaust vent B or one of the temperature of the air intake vent C and the temperature of the air exhaust vent D.

15. The cooling system according to claim 14, wherein the controller is further configured to:
when the cooling supplement component is in a working state, the spraying apparatus is turned on, and one of the temperature of the air intake vent A is higher than the temperature of the air exhaust vent B or the temperature of the air intake vent C is lower than the temperature of the air exhaust vent D, control an opening degree of the first air valve to decrease, wherein the temperature of the air intake vent A is obtained based on the temperature of the fresh air.

16. The cooling system according to claim 14, wherein the temperature sensor comprises a first temperature sensor, and the first temperature sensor is configured to monitor the temperature of the fresh air that enters the heat exchanger through the air intake vent A.

17. The cooling system according to claim 16, wherein the first temperature sensor is disposed between the spraying apparatus and the heat exchanger, and the temperature of the fresh air that is monitored by the first temperature sensor is the temperature of the air intake vent A.

18. The cooling system according to claim 16, wherein the first temperature sensor is disposed on a side of the spraying apparatus and that is away from the heat exchanger, and when the spraying apparatus is turned on, a difference between the temperature of the fresh air that is monitored by the first temperature sensor and a temperature that can be lowered for the outdoor fresh air by the spraying apparatus is the temperature of the air intake vent A.

19. A data center, comprising:
an electronic device disposed in an equipment room; and
a cooling system configured to perform cooling and heat dissipation on the electronic device,
wherein the cooling system comprises:
  a heat exchanger;
  a cooling supplement component;
  a bypass vent valve;
  a temperature sensor; and
  a controller,
wherein the heat exchanger comprises:
  an air intake vent A and an air exhaust vent B that are configured to be used for outdoor fresh air entry and discharge; and
  an air intake vent C and an air exhaust vent D that are configured to be used for indoor return air entry and discharge,
wherein the cooling supplement component comprises:
  a condenser connected to the air exhaust vent B by using an exhaust air pipe; and
  an evaporator connected to the air exhaust vent D,
wherein the bypass vent valve is disposed on the exhaust air pipe, and the bypass vent valve communicates with outdoor air,
wherein the bypass vent valve is connected to the controller, and the controller is configured to control the bypass vent valve,
wherein the temperature sensor is configured to monitor a temperature of fresh air that enters the heat exchanger through the air intake vent A and a temperature of the air exhaust vent B, or configured to monitor a temperature of the air intake vent C and a temperature of the air exhaust vent D, and
wherein the controller is further configured to:
  control the bypass vent valve based on the temperature of the fresh air and the temperature of the air exhaust vent B or one of the temperature of the air intake vent C and the temperature of the air exhaust vent D.

20. The data center according to claim 19, wherein the cooling system further comprises a first air valve, the first air valve is disposed in a fresh air pipe communicating with the air intake vent A, and the fresh air pipe communicates with outdoor air; and
the controller is further configured to control the first air valve.

* * * * *